United States Patent
Song et al.

[11] Patent Number: 5,897,339
[45] Date of Patent: Apr. 27, 1999

[54] LEAD-ON-CHIP SEMICONDUCTOR DEVICE PACKAGE HAVING AN ADHESIVE LAYER FORMED FROM LIQUID ADHESIVE AND METHOD FOR MANUFACTURING THE SAME

[75] Inventors: Young Jae Song, Seongnam; Se Yong Oh, Seoul; Tae Je Cho, Yongin; Seung Ho Ahn, Suwon; Min Ho Lee, Yongin, all of Rep. of Korea

[73] Assignee: Samsung Electronics Co., Ltd., Suwon, Rep. of Korea

[21] Appl. No.: 08/915,668

[22] Filed: Aug. 21, 1997

[30] Foreign Application Priority Data

Sep. 11, 1996 [KR] Rep. of Korea ............... 96-39323
Nov. 8, 1996 [KR] Rep. of Korea ............... 96-52966

[51] Int. Cl.$^6$ .................. H01L 21/44; H01L 21/48; H01L 21/50
[52] U.S. Cl. ........................... 438/118; 438/106
[58] Field of Search .................... 438/118, 106

[56] References Cited

U.S. PATENT DOCUMENTS

| | | | |
|---|---|---|---|
| 5,180,691 | 1/1993 | Adachi et al. | 438/127 |
| 5,378,656 | 1/1995 | Kajihara et al. | 438/118 |
| 5,612,259 | 3/1997 | Okutomo et al. | 438/118 |
| 5,631,191 | 5/1997 | Durand et al. | 438/119 |

*Primary Examiner*—Kevin M. Picardat
*Assistant Examiner*—Deven Collins
*Attorney, Agent, or Firm*—Jones, Volentine, Steinberg, & Whitt, L.L.P.

[57] ABSTRACT

A lead-on-chip semiconductor device package is formed by attaching a lead frame having a single adhesive layer to a semiconductor chip. Electrode pads of the chip are electrically connected by bonding wires and mechanically connected by the adhesive layer to the lead frame, and then encapsulated by an encapsulant such as molding compound. The adhesive layer is formed from a liquid adhesive having a certain viscosity. The adhesive material is continuously applied to spaces between adjacent inner leads as well as the top surface of the leads and then cured. The leads are disposed at the same intervals and include some side leads with a larger width in order to form the adhesive layer with a uniform thickness. Thermoplastic resins are preferably used as the adhesive, but thermosetting resins may be used as well. In the case of thermoplastic resins, the temperature of a cure step is about 200° C. and that of chip attachment step is about 400° C.

10 Claims, 7 Drawing Sheets

LEAD-ON-CHIP SEMICONDUCTOR DEVICE PACKAGE HAVING AN ADHESIVE LAYER FORMED FROM LIQUID ADHESIVE AND METHOD FOR MANUFACTURING THE SAME

BACKGROUND OF THE INVENTION

1. Field of the Invention

The present invention generally relates to lead-on-chip semiconductor device packages, and more particularly, to a method and a resulting structure for attaching a semiconductor chip and the lead frame with a liquid adhesive layer.

2. Description of the Related Art

As the integration density of a semiconductor integrated circuit (IC) device increases, so does the size of the semiconductor chip. However, efforts continue in order to reduce the size of the semiconductor chip packages to meet the demand for smaller devices. To meet this need for package miniaturization, various packaging technologies have been developed. One of them is the lead-on-chip (LOC) package technology, in which a plurality of leads are disposed on and attached to an active surface of a semiconductor chip.

A primary advantage of the LOC package is that a chip mounting area, also known as a die pad or a lead frame pad, is not required since the chip is attached to the leads. Accordingly, the ratio of the size of the semiconductor chip to the size of the package is quite high. Other advantages of the LOC package include a high lead frame design flexibility, enhanced electrical performance, and the like.

Figure 1:
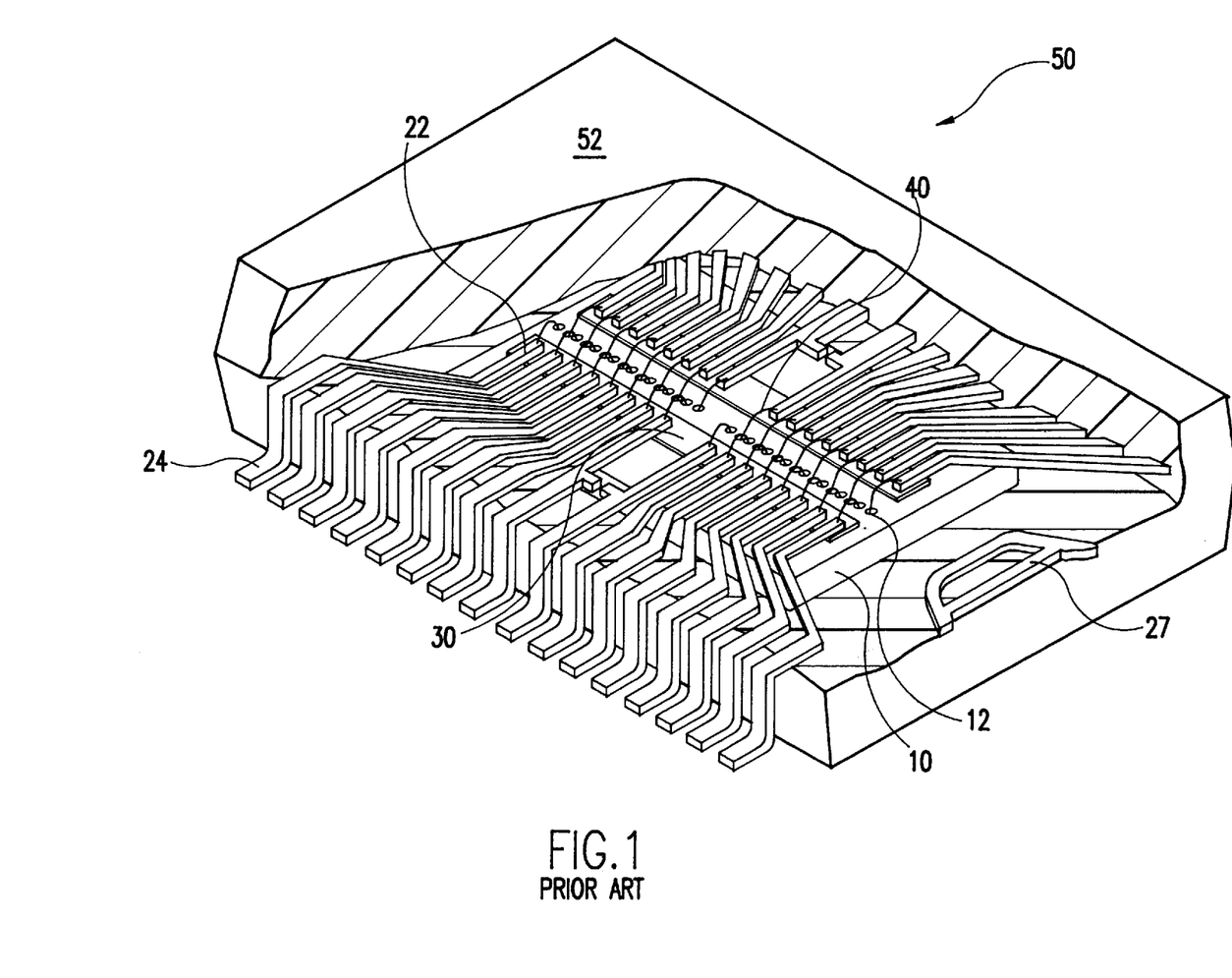
FIG. 1 is a partially cut away perspective view of a conventional lead-on-chip semiconductor device package.
Figures 2A, 2B:
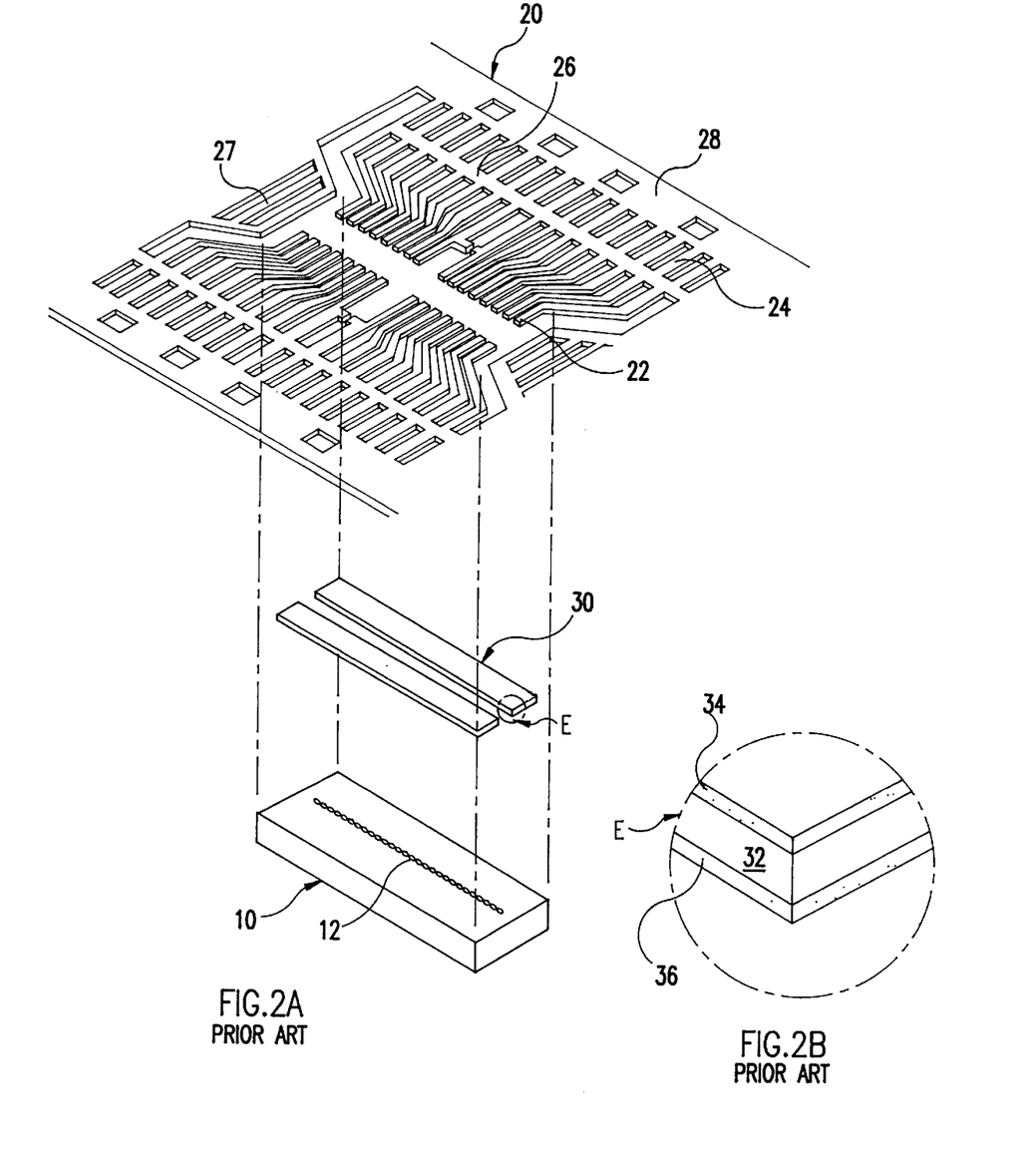
FIG. 2A is an exploded perspective view illustrating the spatial relationship between a semiconductor chip, an adhesive tape, and a lead frame, in the package shown in FIG. 1.
FIG. 2B is a detailed view of portion E of FIG. 2A.

A conventional LOC semiconductor device package is depicted in FIGS. 1, 2A and 2B. FIG. 1 shows a conventional LOC package 50 in a partially cut away perspective view; FIG. 2A illustrates, in an exploded perspective view, the spatial relationship between a semiconductor chip 10, an adhesive tape 30, and a lead frame 20, in the LOC package 50 shown in FIG. 1; and FIG. 2B is a more detailed view of the adhesive layer portion E of FIG. 2A.

With reference to FIGS. 1, 2A and 2B, the conventional LOC package 50 is constructed so that a plurality of inner leads 22 of the lead frame 20 are attached to an active surface of the semiconductor chip 10. Adhesion between the lead frame 20 and the semiconductor chip 10 is generally accomplished by multiple pieces of the adhesive tape 30. The adhesive tape 30 may comprise three layers, namely, a base film 32 and two adhesive layers 34, 36 formed respectively on each side of the base film 32. The base film 32 is typically a polyimide film and the adhesive layers 34, 36 are typically thermosetting epoxy resin layers. The semiconductor chip 10 has a plurality of electrode pads 12 which are centrally formed on the active surface. The inner leads 22 are spaced apart so that the central electrode pads 12 are exposed between the respective groups of inner leads 22, one on each side of the pads 12, and the inner leads 22 are electrically connected to the electrode pads 12.

Each of the inner leads 22 of the lead frame 20 is brought in close proximity to corresponding ones of the electrode pads 12, which are located along the center of the semiconductor chip 10, and thus the lead frame 20 can be electrically connected to the semiconductor chip 10 by means of short bonding wires 40.

A package body 52 is formed by encapsulants such as epoxy resins in order to protect the semiconductor chip 10, the inner leads 22, and the bonding wires 40 from hostile environments. After encapsulation, the dam bars 26 and lead frame salvage 28 shown in FIG. 2A are removed, and then outer leads 24, which extend from the package body 52 as shown in FIG. 1, are formed into an adequate shape for surface-mounting of the package 50 onto an external system board (not shown). Tie bars 27 support the package 50 during the shape-transformation of the outer leads 24.

The assembly process of the conventional LOC package 50 can be described as follows. First, a suitably sized three-layer adhesive tape 30 is positioned under the inner leads 22 of the lead frame 20, and the semiconductor chip 10 is then positioned under the three-layer adhesive tape 30. The adhesive tape 30 is attached to the inner leads 22 of the lead frame 20 by the first adhesive layer 34, and then the semiconductor chip 10 is attached to the adhesive tape 30 by the second adhesive layer 36, by applying pressure to the tape 30 at a predetermined temperature. Subsequent process steps, such as wire bonding interconnection, encapsulation, and outer lead frame forming are successively conducted.

However, the conventional LOC package suffers some drawbacks. One problem is the structure of adhesive tape itself. Since the adhesive tape consists of three layers, four interfaces exist between the semiconductor chip and the lead frame. The interfaces between two heterogeneous materials can produce thermo-mechanical stresses, and easily cause mechanical failures of the package such as cracks or delaminations. Moreover, the high water absorption property of the adhesive tape can degrade the reliability of the LOC package.

Another problem is found in the production process for the adhesive tape. The three-layer adhesive tape is made by successive sequences: first, adhesive materials are coated on one side of the base film 32 and cured to a so-called B-stage (i.e., a semi-solid state), and then also coated on the other side of the base film 32 and cured. Accordingly, the tape production process is complicated and the adhesive tape 30 is difficult to handle since it has adhesive layers on both sides thereof.

Moreover, the adhesive tape 30 contains an expensive inner polyimide film core, which consequently results in high production costs.

SUMMARY OF THE INVENTION

The present invention provides a lead-on-chip semiconductor device package with improved reliability by reducing the number of interfaces associated with adhesive tape.

The present invention also provides a method for manufacturing a lead-on-chip semiconductor device package with a process of forming the adhesive layer by coating a liquid adhesive on a lead frame.

Still further, the present invention provides a lead-on-chip semiconductor device package which can be produced inexpensively.

These and other advantages of the present invention are attained by a lead-on-chip semiconductor device package which has an adhesive layer formed from a liquid adhesive to attach a lead frame to a semiconductor chip. The semiconductor chip has a plurality of electrode pads on its active surface. Preferably the electrode pads are formed on a central part of the active surface. The lead frame has a plurality of inner leads and a plurality of outer leads. The inner leads are placed over the active surface of the semiconductor chip so that the electrode pads are exposed through an opening between the inner leads. The adhesive layer is positioned between the active surface of the semiconductor chip and the inner leads of the lead frame. By applying the liquid adhesive, the adhesive layer is formed as a continuum across the inner leads and spaces between adjacent inner leads.

In order to form a uniform adhesive layer, the inner leads are equally spaced apart and dummy leads may be inserted between the inner leads to ensure the equal intervals. Moreover, the outermost inner leads may have a larger width than the other inner leads.

Each electrode pad is electrically interconnected to a corresponding inner lead by means of a bonding wire. The semiconductor chip, the adhesive layer, the inner leads of the lead frame, and the bonding wires are then encapsulated with an encapsulant such as a molding compound.

An additional adhesive layer, which is spaced apart from the previously mentioned adhesive layer, may be positioned closer to the edge of the semiconductor chip to prevent the inner leads from touching the chip edge during the chip attachment process.

According to the present invention, the above lead-on-chip semiconductor device package is manufactured by the following method. First, a semiconductor chip and a lead frame are prepared. The semiconductor chip has an active surface on which a plurality of electrode pads are formed, and the lead frame has a plurality of inner leads and a plurality of outer leads. Then a liquid adhesive having a predetermined viscosity is applied to the inner leads, with the adhesive layer being formed from the liquid adhesive. In this case, the liquid adhesive is continuously applied to both the top surface of the inner leads and the spaces between the inner leads. Next, the semiconductor chip is attached to the lead frame by means of the adhesive layer. During the attachment process, the inner leads of the lead frame are placed over the active surface of the semiconductor chip so that the electrode pads of the semiconductor chip are exposed between the inner leads. After that, the electrical interconnection between the electrode pads and the inner leads is carried out using bonding wires, and the encapsulation is conducted.

In the present invention, a coating method using a dispenser is preferably used for applying the liquid adhesive to the inner leads. The dispenser also enables the liquid adhesive to be continuously applied to all the inner leads which are disposed in the same row. Thermoplastic resins such as polyether amid, polyimide siloxane, and polyimide are preferably used for the adhesive layer, but thermosetting resins can be used as well. With a thermoplastic resin, the adhesive layer is formed by curing it at a temperature of about 200° C. and the chip attachment process is conducted by thermocompressing the adhesive layer at a temperature of about 400° C. With a thermosetting resin, the adhesive layer is formed at a temperature of about 150° C. and the chip attachment process is conducted at a temperature of about 200° C.

BRIEF DESCRIPTION OF THE DRAWINGS

These and various other features and advantages of the present invention are set forth in the following detailed description with reference to the accompanying drawings, in which.

DETAILED DESCRIPTION OF THE PRESENT INVENTION

The present invention will now be described in detail with reference to accompanying drawings.

Figure 3A:
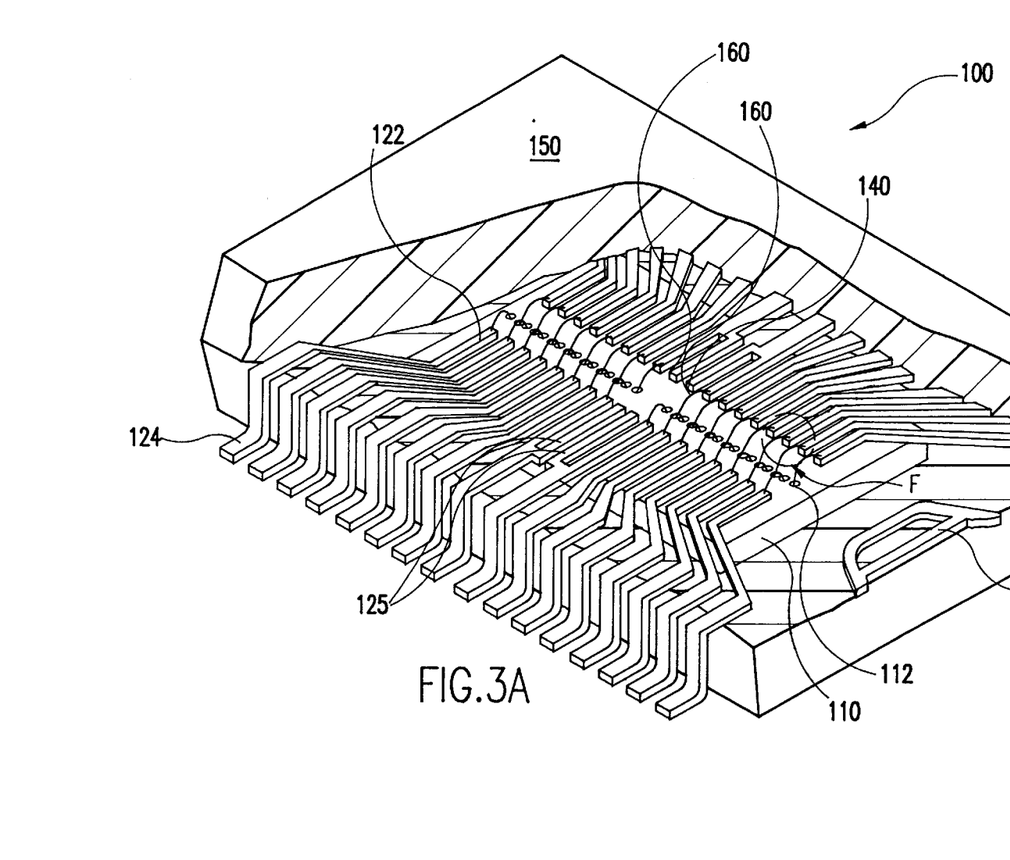
FIG. 3A is a partially cut away perspective view of one embodiment of a lead-on-chip semiconductor device package in accordance with the present invention.
Figure 3B:
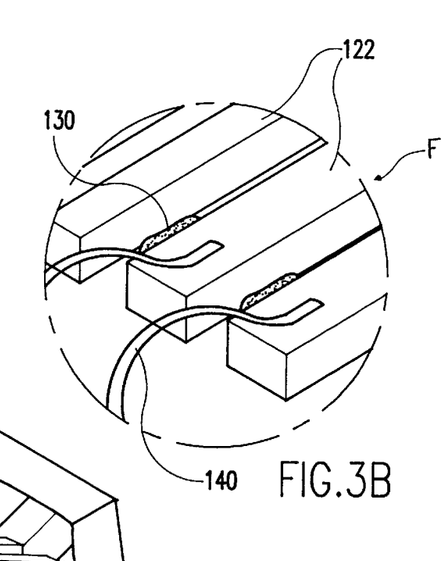
FIG. 3B is a detailed view of portion F of FIG. 3A.
Figures 4A, 4B:
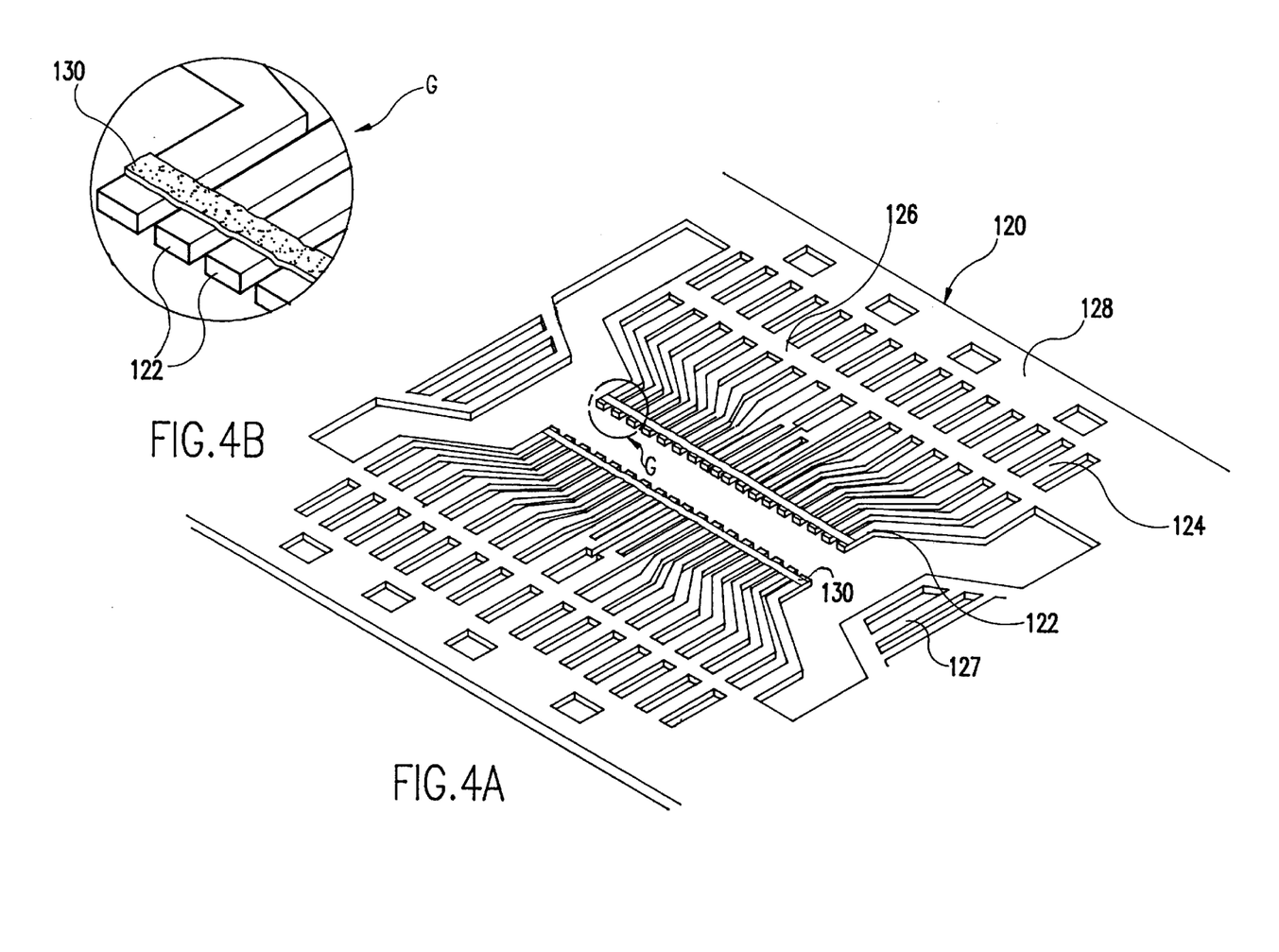
FIG. 4A is a perspective view of a lead frame, which is employed in the package of FIG. 3A, having an adhesive layer formed from a liquid adhesive.
FIG. 4B is a detailed view of portion G of FIG. 4A.

FIG. 3A is a partially cut away perspective view of one embodiment of a lead-on-chip (LOC) semiconductor device package 100 in accordance with the present invention; FIG. 3B is a detailed view of portion F of FIG. 3A; FIG. 4 is a perspective view of a lead frame 120, which is employed in the package 100 of FIG. 3A, having an adhesive layer 130 formed from a liquid adhesive; and FIG. 4B is a detailed view of portion G of FIG. 4A;

The LOC semiconductor device package 100 has a structure where a plurality of inner leads 122 of the lead frame 120 are attached to an active surface of a semiconductor chip 110. This attachment between the semiconductor chip 110 and the lead frame 120 is accomplished by the single adhesive layer 130 instead of the conventional three-layer adhesive tape. The semiconductor chip 110 has a plurality of electrode pads 112 which are formed on the active surface of the semiconductor chip 110. The electrode pads 112 are preferably, but not necessarily, formed at a central part of the active surface. Because the electrode pads 112 of the semiconductor chip 110 will be electrically interconnected to the inner leads 122 of the lead frame 120 after the attachment between the semiconductor chip 110 and the lead frame 120, the inner leads 122 are disposed so that the electrode pads 112 are exposed between the inner leads 122.

The electrical interconnection between the semiconductor chip 110 and the lead frame 120 is accomplished by using bonding wires 140. The semiconductor chip 110, the adhesive layer 130, the inner leads 122 of the lead frame 120, and the bonding wires 140 are encapsulated with an encapsulant such as epoxy molding compounds to form a package body 150, which provides a protection from hostile environments. After this encapsulation is completed, the dam bars 126 and lead frame salvage 128 shown in FIG. 4A are removed, and then outer leads 124, which are shown in FIG. 3A and extend from the package body 150, are formed into an adequate shape for surface-mounting onto an external system board (not shown). The dam bars 126, which are located across the inner leads 122 and the outer leads 124, impart some rigidity to the lead frame 120 and prevent overflow of the encapsulant during encapsulation. Tie bars 127, which still remain inside the package body 150, support the package 100 during the shape-transformation of the outer leads 124.

Reference numeral 125 in FIG. 3A designates a dummy lead, which will be described in more detail later in the specification.

As set forth previously, adhesive layer 130 is used to attach the lead frame 120 and the semiconductor chip 110. The adhesive layer 130 is a single layer formed from a liquid adhesive having a predetermined viscosity. The liquid adhesive is continuously applied to the inner leads 122 of the lead frame 120 and then cured, i.e., heat-treated.

Figure 5:
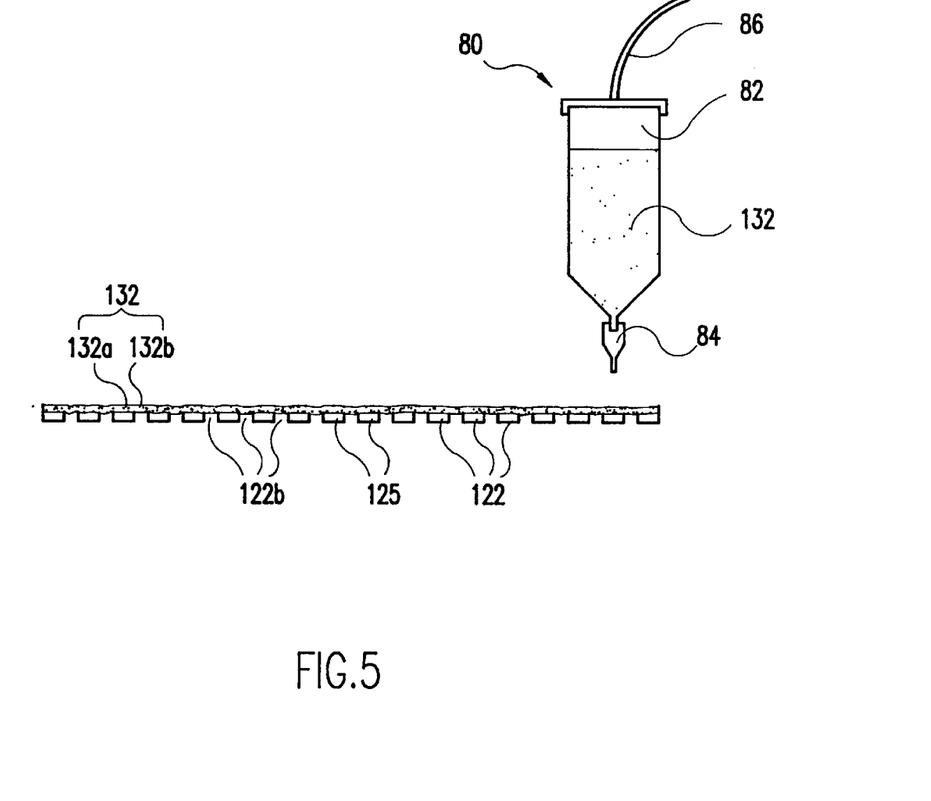
FIG. 5 is a schematic view illustrating a process of applying the liquid adhesive to the lead frame to produce the adhesive layer of FIG. 4.

FIG. 5 illustrates a process of applying the liquid adhesive 132 to the inner leads 122 for forming of the adhesive layer 130 of FIGS. 4A and 4B. The liquid adhesive 132 is applied to the inner leads 122 by using a means for applying 80 as shown in FIG. 5, and then is turned into the B-stage adhesive layer 130 of FIGS. 4A and 4B after a curing step. The liquid adhesive 132 may be a thermoplastic resin or a thermosetting resin which is electrically non-conductive, but thermoplastic resins such as polyether amid, polyimide siloxane, and polyimide are mainly used since they are easy to handle and may be reworked if necessary.

The adhesive 132 remains in a liquid state and has a predetermined viscosity. Most adhesive materials 132 contain a solvent to maintain a liquid state, accordingly it is possible to control the viscosity of the adhesive by controlling the content of the solvent. The adhesive 132 must remain in the liquid state so that it is possible to continuously apply the adhesive 132 to the inner leads 122 in order to form the adhesive layer 130. Another reason for maintaining the liquid adhesive 132 at a predetermined viscosity is the adhesive 132 should be able to reside in the spaces 122b between the inner leads 122 under a controlled application condition.

It is important that the liquid adhesive material 132 reside in every space 122b between the inner leads as well as each top surface of the inner leads 122. In effect, the liquid adhesive material 132 forms a continuous layer with no discontinuities in any of the spaces 122. It is also important that the adhesive layer 130 have a uniform thickness, otherwise, some failures may occur in the subsequent chip attachment or wire bonding interconnection steps because of the non-uniform thickness.

Referring to FIG. 5, if the liquid adhesive 132b which is formed in the spaces 122b undesirably slides down to far, it may cause the liquid adhesive 132a which exists on the top surface of the inner leads 122 to be unevenly formed. Accordingly, it is necessary to control the viscosity of the liquid adhesive 132 so that the liquid adhesive 132 can reside in the space 122b as well as on the inner leads 122. This may also improve the co-planarity of the inner leads 122.

In the illustrated embodiment, for example, if the inner leads 122 are 16 mils wide and the space 122b is 6 mils wide, the liquid adhesive 132 may have a viscosity of approximately 22000 centipoises.

It is desirable that the inner leads 122 be disposed at regularly spaced intervals so that the adhesive layer 130 has a uniform thickness, as well as simplifying the adhesive application step and enhancing reliability. Dummy leads 125 (see FIG. 3A), which are not interconnected to the semiconductor chip 110, are arranged between the inner leads 122 so that all the inner leads 122 have the same interval.

A means for applying, such as dispenser 80 shown in FIG. 5, is used for applying the liquid adhesive 132. The dispenser 80 comprises a syringe 82 which holds the liquid adhesive 132, a nozzle 84 which is used as a means for dispensing the liquid adhesive 132 from the syringe 82, and a pressing tube 86 which is used for pressing down on the liquid adhesive 132. Additionally, a moving mechanism (not shown) may be coupled to the dispenser 80 to the dispenser 80 to move in a direction perpendicular to the inner leads 122. When a certain pressure is applied by the pressing tube 86 to the liquid adhesive 132 held in the syringe 82, the inner leads 122 are coated with the liquid adhesive 132 as the dispenser 80 moves at a uniform velocity by means of the moving mechanism.

The liquid adhesive 132 applied to the inner leads 122 is transformed into the B-stage (semi-solid state) adhesive layer 130 after a curing step. Any solvent contained in the adhesive 132 is removed during the cure step. With thermoplastic resins, the cure step is conducted at a temperature of about 200° C., while with thermosetting resins, the temperature of the cure step is carried out at about 150° C.

Figure 6:
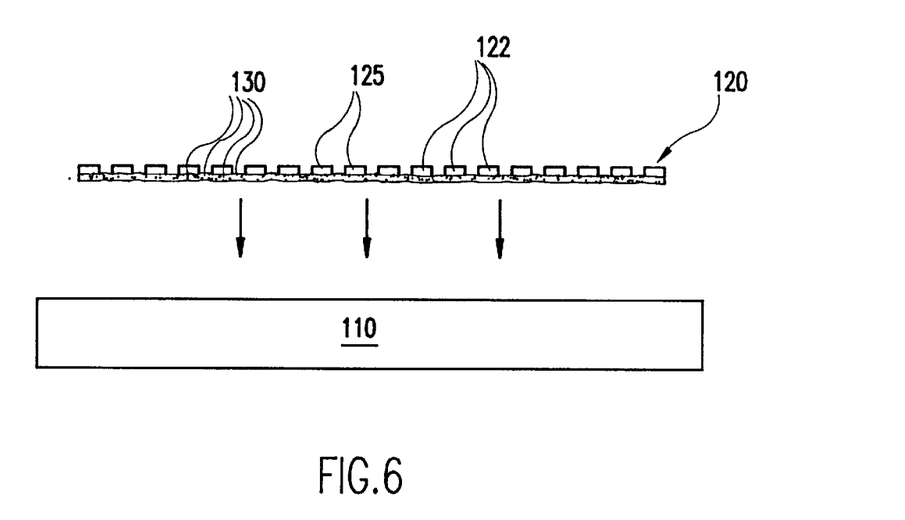
FIG. 6 is a schematic view illustrating a process of attaching a semiconductor chip to the lead frame of FIG. 4A having the adhesive layer.

After the cure step, the chip attachment step using a thermocompressing method is performed as shown in FIG. 6. The lead frame 120 having the B-stage adhesive layer 130 is first arranged over the active surface of the semiconductor chip 110 so that the adhesive layer 130 is between the inner leads 122 and the chip 110, and then attached to the chip 110 by using the thermocompression method. This chip attachment step is conducted at a temperature of about 400° C. for thermoplastic resins and about 200° C. for thermosetting resins. The thermoplastic resins need to be cured at a higher temperature in the chip attachment step than the thermosetting resins since the former has a higher glass transition temperature (Tg).

Summarizing, the liquid adhesive material 132 is applied to the inner leads 122, then heat-cured to form the B-stage adhesive layer 130, followed by attaching the inner leads 122 to the chip 110. The lead frame in FIGS. 4A and 4B show the cured adhesive layer and the LOC package in FIGS. 3A and 3B show the lead frame completely attached to the semiconductor chip.

With the present invention, which has a single adhesive layer 130 rather than the conventional three layer adhesive tape, the lead-on-chip semiconductor device package has improved reliability by reducing the number of interfaces between the inner leads 122 and the chip 110. Furthermore, since the adhesive layer 130 is formed through a simple application step, it provides a less expensive package production cost than the conventional three-layer adhesive tape. Moreover, poor reliability caused by the inadvertent cutting of the adhesive tape can be eliminated.

The adhesive layer 130 of the present invention has a thickness of about 20 $\mu$m compared to about 40 to 50 $\mu$m for the conventional adhesive tape. Therefore, the inner leads 122 may touch the active surface of the semiconductor chip 110 in the chip attachment step if the co-planarity between the inner leads 122 and the semiconductor chip 110 surface is not uniform.

Figure 7:
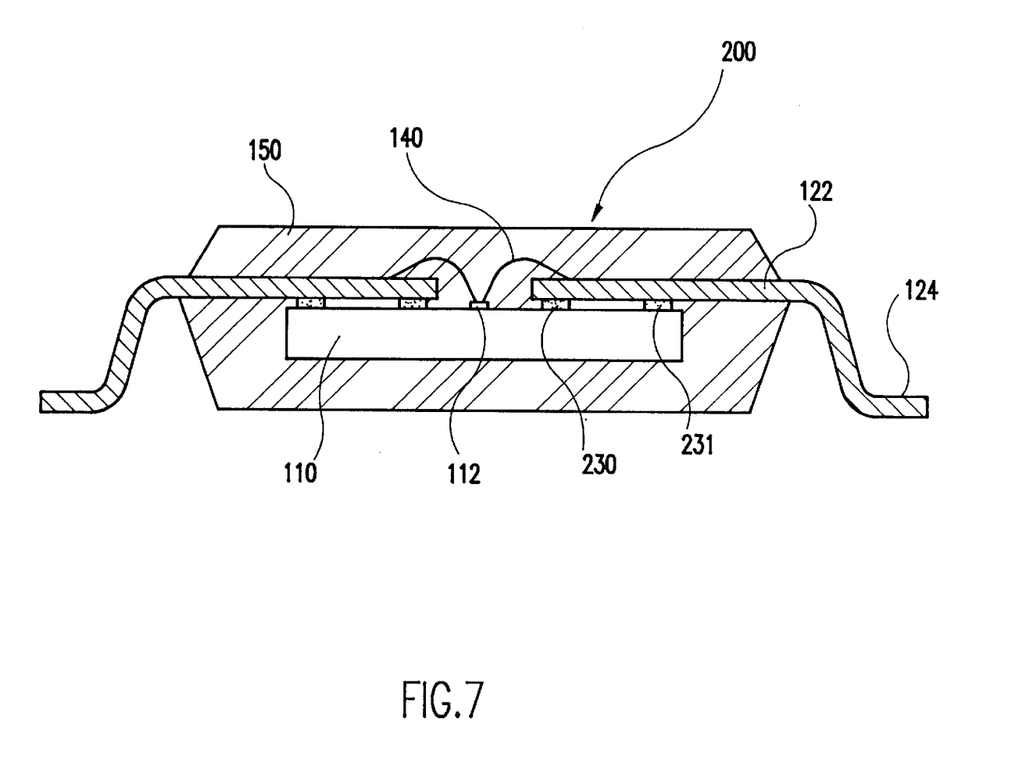
FIG. 7 is a cross-sectional view of another embodiment of a lead-on-chip semiconductor device package in accordance with the present invention.
Figures 8A, 8B:
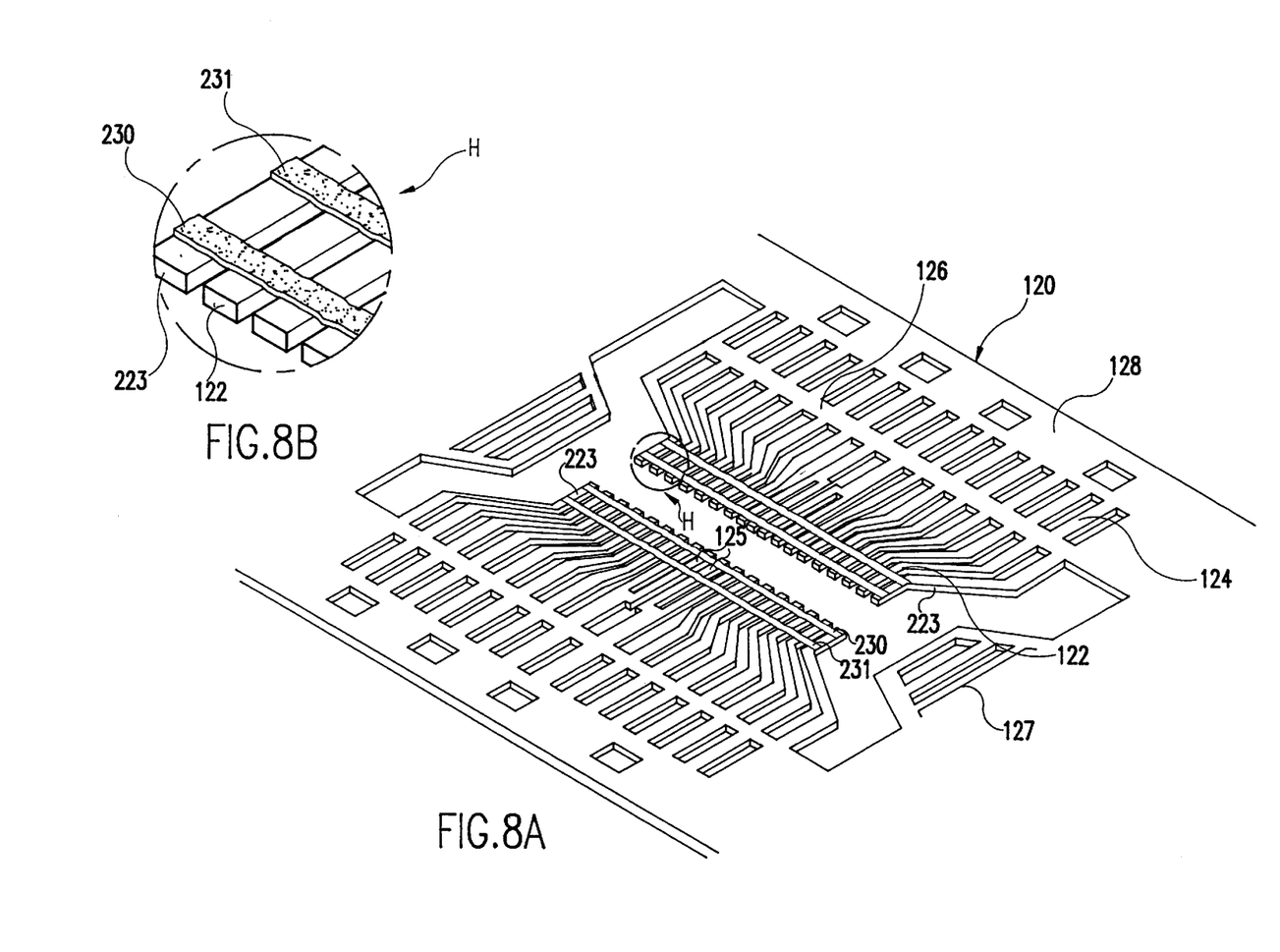
FIG. 8A is a perspective view of a lead frame having two adhesive layers which is employed in the package of FIG. 7.
FIG. 8B is a detailed view of portion H of FIG. 8A.

In order to prevent this problem, two rows of the adhesive layer can be formed as described in the following embodiment. FIG. 7 is a cross-sectional view of another embodiment of a lead-on-chip semiconductor device package 200 in accordance with the present invention; FIG. 8A is a perspective view of a lead frame 120 having two adhesive layers 230, 231 employed in the package 200 of FIG. 7; and FIG. 8B is an enlarged view of portion H of FIG. 8A. The additional adhesive layer 231 is formed in order to prevent the unwanted contact between the semiconductor chip 110 and the inner leads 122. The additional adhesive layer 231 is formed as described with reference to FIGS. 5 and 6, and is spaced apart from the adhesive layer 230 and closer to the edge of the semiconductor chip 110.

The inner leads 122 may further comprise side leads 223 shown in FIGS. 8A and 8B. These side leads 223 are arranged at the outermost sides of the inner leads 122, with the side leads 223 having a larger width than the other inner leads 122. When a liquid adhesive 232 is applied to the inner leads 122 by means of the dispenser 80 of FIG. 5, the thickness of the applied adhesive 232 may be uneven at the both starting and ending points due to undesirable drips of the liquid material 232 or a non-uniform dispensing velocity of the dispenser. Accordingly, the wider side leads 223 at the both starting and ending points ensure a uniform thickness across the inner leads 122.

The remaining reference numerals in FIGS. 7, 8A and 8B have the same structure and function as in the previous embodiment in FIGS. 4A and 4B, therefore, the detailed description thereof will be omitted.

The present invention has many advantages. One is that the number of interfaces between the inner leads and the chip is reduced and the reliability is improved because the lead-on-chip semiconductor device package has the single adhesive layer. Another advantage is that the adhesive layer is easily produced through a process in which the liquid adhesive is applied to the inner leads of the lead frame and then cured. As a result, the present invention provides a lead-on-chip semiconductor device package with a simple manufacturing process, a lower production cost, and an improved reliability.

Although the present invention has been described in detail with reference to certain preferred embodiment various changes in filled in the art should understand that various changes in form and details may be made without departing from the spirit and scope of the invention as defined by the appended claims and their equivalents. For example, a screen-printing method or spraying method is possible as a method for applying the liquid adhesive.

What is claimed is:

1. A method for manufacturing a lead-on-chip semiconductor device package, comprising steps of:

preparing a semiconductor chip and a lead frame, said semiconductor chip having an active surface on which a plurality of electrode pads are formed, and said lead frame having a plurality of inner leads and a plurality of outer leads;

applying a liquid adhesive to said plurality of inner leads of said lead frame to form an adhesive layer, wherein said liquid adhesive is continuously applied to both a surface of said plurality of inner leads and spaces between adjacent of said plurality of inner leads;

attaching said plurality of inner leads of said lead frame to said active surface of said semiconductor chip using said adhesive layer, said adhesive layer being positioned between said semiconductor chip and said lead frame, such that said plurality of inner leads of said lead frame are placed over said active surface of said semiconductor chip and said plurality of electrode pads of said semiconductor chip are exposed between opposing rows of said plurality of inner leads;

electrically interconnecting said respective ones of said electrode pads to corresponding ones of said lead frame using a bonding wire; and encapsulating said semiconductor chip, said adhesive layer, said plurality of inner leads of said lead frame, and said plurality of bonding wires, with an encapsulant.

2. The method of claim 1, wherein the step of applying said liquid adhesive to said plurality of inner leads comprises a step of coating said plurality of inner leads with said liquid adhesive material by using a dispenser.

3. The method of claim 2, wherein the step of coating said plurality of inner leads with said liquid adhesive is continuously conducted on said inner leads which are disposed in one of the opposing rows.

4. The method of claim 1, wherein said adhesive layer is formed from a thermoplastic resin.

5. The method of claim 4, wherein the thermoplastic resin is selected from the group consisting of polyether amid, polyimide siloxane, and polyimide.

6. The method of claim 4, wherein the step of forming said adhesive layer by applying the thermoplastic resin to said plurality of inner leads comprises a step of curing the thermoplastic resin at a temperature of about 200° C.

7. The method of claim 4, wherein the step of attaching said lead frame to said semiconductor chip using said adhesive layer comprises a step of thermocompressing said adhesive layer at a temperature of about 400° C.

8. The method of claim 1, wherein said adhesive layer is formed from a thermosetting resin.

9. The method of claim 8, wherein the step of forming said adhesive layer by applying the thermosetting resin to said plurality of inner leads comprises a step of curing the thermosetting resin at a temperature of about 150° C.

10. The method of claim 8, wherein the step of attaching said lead frame to said semiconductor chip using said adhesive layer comprises a step of thermocompressing said adhesive layer at a temperature of about 200° C.

* * * * *